United States Patent [19]

Yamashita

[11] Patent Number: 5,610,682
[45] Date of Patent: Mar. 11, 1997

[54] PHOTOGRAPHING METHOD AND PHOTOSENSITIVE MATERIAL PRINTING APPARATUS UTILIZING THE SAME

[75] Inventor: Miyuki Yamashita, Tokyo, Japan

[73] Assignee: Hirakawa Kogyo Sha Co., Ltd., Tokyo, Japan

[21] Appl. No.: 367,860

[22] Filed: Jan. 3, 1995

[30] Foreign Application Priority Data

Apr. 20, 1994 [JP] Japan .................................. 6-104560

[51] Int. Cl.[6] ........................... G03B 27/48; G03B 27/50; G03B 27/70
[52] U.S. Cl. ................................ 355/51; 355/23; 355/49; 355/66
[58] Field of Search .................... 355/23, 24, 49, 355/51, 66, 77

[56] References Cited

U.S. PATENT DOCUMENTS

| | | | |
|---|---|---|---|
| 3,885,871 | 5/1975 | Galatha et al. ............................. | 355/23 |
| 4,734,742 | 3/1988 | Klumpp et al. ............................ | 355/23 |
| 4,736,225 | 4/1988 | Tanaka et al. .............................. | 355/1 |
| 4,864,359 | 9/1989 | Yamasaki et al. ......................... | 355/51 |
| 4,937,612 | 6/1990 | Shogren .................................... | 355/24 |
| 5,280,321 | 1/1994 | Siryk ......................................... | 355/23 |

OTHER PUBLICATIONS

Patent Abstracts of Japan, vol. 11, No. 173 (1987) p. 582.
European Search Report dated Aug. 9, 1995.

*Primary Examiner*—Arthur T. Grimley
*Assistant Examiner*—Herbert V. Kerner
*Attorney, Agent, or Firm*—Millen, White, Zelano, & Branigan, P.C.

[57] ABSTRACT

Disclosed are a photographic method which including optically dividing the picture plane of a great-size original into two areas and photographing said areas with a specified combination of a lens having a narrow angle of view with two or three pairs of mirrors to form the images of the original on the same plane, and a photosensitive material printing apparatus utilizing the above photographing method.

8 Claims, 10 Drawing Sheets

PHOTOGRAPHING METHOD AND PHOTOSENSITIVE MATERIAL PRINTING APPARATUS UTILIZING THE SAME

FIELD OF THE INVENTION

The present invention relates to a method and an apparatus for photographing a great-size original with a lens having a narrow angle of view and, more particularly, to a method suitable for production of a negative film or direct press plate used for printing a combination of pages, and to an apparatus for printing photosensitive materials utilizing the aforementioned photographing method.

BACKGROUND OF THE INVENTION

In producing press plates for printing books or the like, it has so far been carried out to print together a plurality of originals corresponding to, in general, from 8 to 32 pages on one sheet of press plate from the standpoints of printing efficiency and printing cost (See FIG. 1, wherein numeral numbers stand for the page numbers to be printed respectively).

In such a case, press plates of A-size (625 mm×880 mm) or B-size (766 mm×1085 mm) are produced corresponding respectively to whether the size of an intended print is included in the A-series or B-series sizes.

If the photographing of such a great-size picture is intended with an apparatus miniaturized to the greatest possible extent, it is required to use a lens having a wide angle of view and ensuring the highest possible extent of-image reproduction in not only the center part of the picture to be photographed but also the peripheral area thereof. As well known, however, it causes various types of aberration problems to leave a lens as it is small in diameter, notwithstanding the increase in picture area to be photographed with said lens. Therefore, it is requested to use a lens having a great diameter. In case the diameter of a lens is increased, on the other hand, the production cost of the lens rises steeply. Accordingly, it is quite natural from the economical point of view that there is a limit in the diameter of a lens applicable to the photographing apparatus. Under these circumstances, sacrifices of resolution and reproducibility of images have so far been made.

In the meantime, it has hitherto been considered that the greatest possible reduction in size of a picture to be photographed and the use of a lens having a focal length long enough to cover the whole area of the picture was desirable for the purpose of heightening image resolving power and image reproducibility, as described in Japanese Jikko Hei 6-22836 (the term "Jikko" as used herein means an "examined utility model publication"). This measure however has disadvantages in that it is difficult to miniaturize the photographing apparatus and the apparatus cannot help rising in price.

As a result of our intensive studies of the above-described problems, it has been found out that when there is adopted a method which comprises arranging two separate mirrors so that they may reflect respectively thereon the reflected rays coming separately from the left half and the right half of an original and making the rays reflected by the separate mirrors irradiate the front and the back sides of one convex lens respectively, a lens having a focal length reduced to one-half that of the lens required conventionally for the photographing of a picture with a given size can cover a picture increased in size by a factor of two to result in realization of a miniaturized photographing apparatus of high resolving power, thereby achieving the present invention.

SUMMARY OF THE INVENTION

Therefore, a first object of the present invention is to provide a method of ensuring a high resolving power in photographing a great-size original without using a lens having a wide angle of view.

A second object of the present invention is to provide an inexpensive miniature apparatus for printing photosensitive materials which is suitable for preparing negative films used in producing press plates for the printing of books and the like.

A third object of the present invention is to provide an inexpensive miniature apparatus for printing photosensitive materials which is suited to the production of direct press plates for the printing of books and the like.

The above-described objects of the present invention are attained with a photographing method which comprises (i) arranging a convex lens having optical properties symmetrical between the entrance side and the exit side of light in a position above an original such that the center of the lens may lie in the plane which contains the center line dividing the original symmetrically between the left and right halves and is perpendicular to the original; (ii) arranging two pairs of mirrors around said lens such that one pair of first mirrors ① and ①' may be disposed separately on the left side and the right side of said lens, and that in symmetry with respect to the lens on the front side with respect to the optical axis of the lens, and the other pair of second mirrors ② and ②' may be disposed separately on the left side and the right side of said lens, and that in symmetry with respect to the lens on the rear side with respect to the optical axis of the lens, and further the mirrors ① and ②' may be in point symmetry about the center of the lens and that may go for the mirrors ①' and ②, too; and (iii) inclining said mirrors at angles such that the rays incident on the mirror ①, which are rays reflected from the original by imagewise exposure, may pass through the lens and then be reflected by the mirror ②' and, at the same time, the rays incident on the mirror ①', which are rays reflected from the original by imagewise exposure, may pass through the lens and then be reflected by the mirror ②; thereby effecting the image formation on the same plane: said method being characterized in that an area of the original which the mirror ① covers is the left half of the original and one which the mirror ①' covers is the right half of the original: and a photosensitive material printing apparatus utilizing said photographic method.

In accordance with the present photographing method, the whole area of a great-size original can be photographed with a high degree of resolution by using only one small-size lens having a narrow angle of view because the original is photographed under a condition that it is optically divided into two image areas. Thus, the present method is extremely effective in producing press plates for the printing of books and the like.

Moreover, the present apparatus can be considerably reduced in size and production cost since it uses as lens only one small-size lens having a narrow angle of view.

BRIEF DESCRIPTION OF DRAWINGS

FIG. 1 is a plan view of a layout of pages printed on a press plate used for the printing of books and the like.

Figure 1:
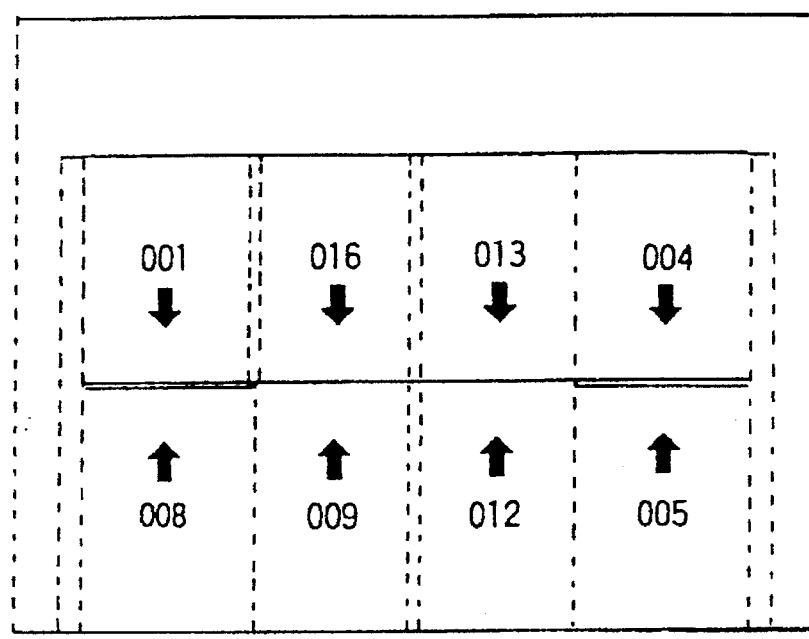

In the above-illustrated Figs., the marks ①, ①', ②, ②', ③ and ③' represent mirrors respectively. The numeral 8 represents a light source for slit exposure, the numeral 10 a lens, the numeral 12 a slit, the numeral 14 an original board, the numeral 15 an original platen, the numeral 21 a photosensitive material, the numeral 23 a punching means, the numeral 24 a stand-by position of image formation (printing) on a photosensitive material, the numeral 25 a position of image formation (printing) on a photosensitive material, and the numeral 26 an automatic developing means.

DETAILED DESCRIPTION OF THE INVENTION

The present invention is illustrated in detail referring to the drawings.

Figure 2:
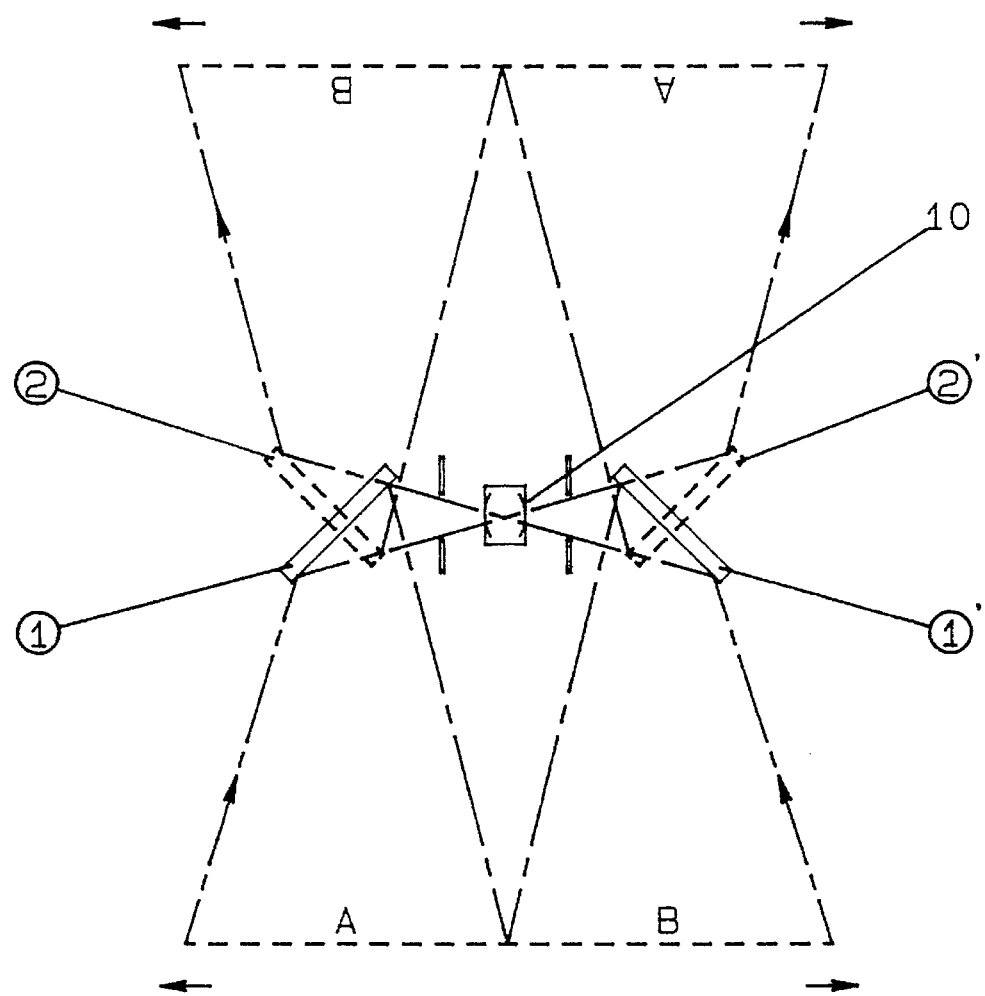
FIG. 2 is a diagrammatic view illustrating the fundamentals of a photographing method according to the present invention, claimed hereinafter in claim 1.

The fundamentals of a photographic method as claimed hereinafter in claim 1 are shown in FIG. 2. Therein, A and B represent the left half and the right half of an original, respectively. A pair of first mirrors ① and ①' and a pair of second mirrors ② and ②' are each disposed symmetrically on the left side and the right side of the lens 10, and these two pairs are arranged respectively in front and rear of the optical axis of the lens 10 (in other words, on the front side and the rear side of the page on which FIG. 2 is drawn). The rays reflected from A are reflected by the mirror ①', then pass through the lens 10, and further reflected by the mirror ②, thereby forming the inverted image of A on a photosensitive material.

Similarly, the rays reflected from B are reflected by the mirror ①, then pass through the lens 10, and further reflected by the mirror ②', thereby forming the inverted image of B on the photosensitive material. In the end, the inverted image of the whole original A and B is formed on one and the same plane. Accordingly, when a photosensitive material is placed on this plane, the inverted image as described above can be printed on the photosensitive material.

Additionally, the magnification upon printing can be changed, if desired, by designing so that the lens may be set at a proper position or by designing so that the lens may be movable.

The photosensitive material used therein is, in general, a negative film used for printing an offset press plate. Of course, it may be a photographic printing paper or a resin plate for relief printing.

Accordingly, even when an original has a great size such as A-Zen size, the whole area of the original can be printed by a proper combination of one lens having a narrow angle of view with mirrors so long as the division of the original in the above-described way causes no impediments. In fact, a straight line is printed on the center of the print obtained (corresponding to the border of A and B). However, this line is generally cut off in the step of bookbinding, and so it causes no trouble at all.

Figure 3:
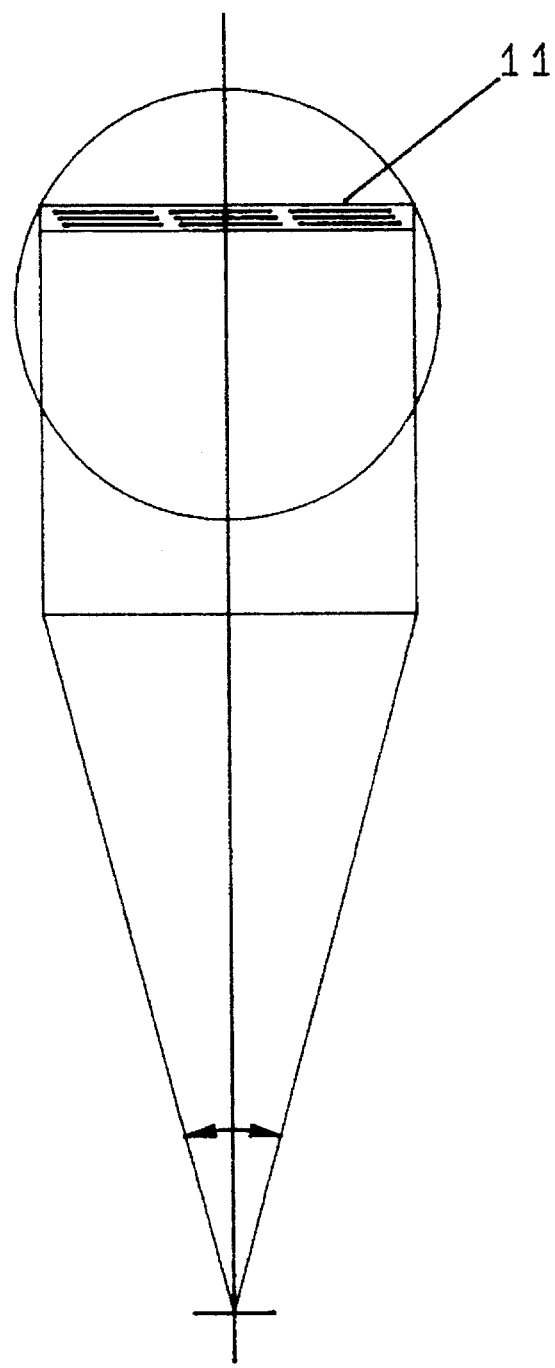
FIG. 3 is a diagram illustrating an angle of view which a lens has.

The term "an angle of view" as used herein signifies the vertical angle of an equilateral triangle having as the base an original width which a lens can cover without suffering its aberration and as the vertex a point placed on the perpendicular bisector of the base, and that at the distance equal to a focal length of the lens from the base (as shown in FIG. 3). In case a comparison is made among lenses with the same diameter, it is known that the resolution a lens can provide is lower the wider angle of view the lens has. Additionally, the numeral 11 in FIG. 3 represents a slit exposure member.

Thus, if it is intended to cover a great-size original using a lens capable of ensuring high resolution, the lens cannot help having a large diameter. As a result of using a lens of large size, a printing apparatus on the whole becomes great in size. In the present invention, on the other hand, the great-size image plane is divided optically into two image areas. Consequently, it becomes possible to cover the whole area of the great-size image plane by the use of only one lens with a narrow angle of view, and so sufficiently high resolution also can be achieved.

The expression "one lens" as used in the present invention does not necessarily mean one-piece lens in a physical sense. In general, a composite lens consisting of two or more pieces of lenses is used in the present invention. In any case, it is required of the lens used in the present invention to provide the same optical performance on which side, the front or the rear of the lens, the incident light may strike on the lens.

For the purpose of miniaturizing a photographing apparatus according to the present invention, it is desirable to use a slit exposure system in an imagewise exposure operation.

Figure 4:
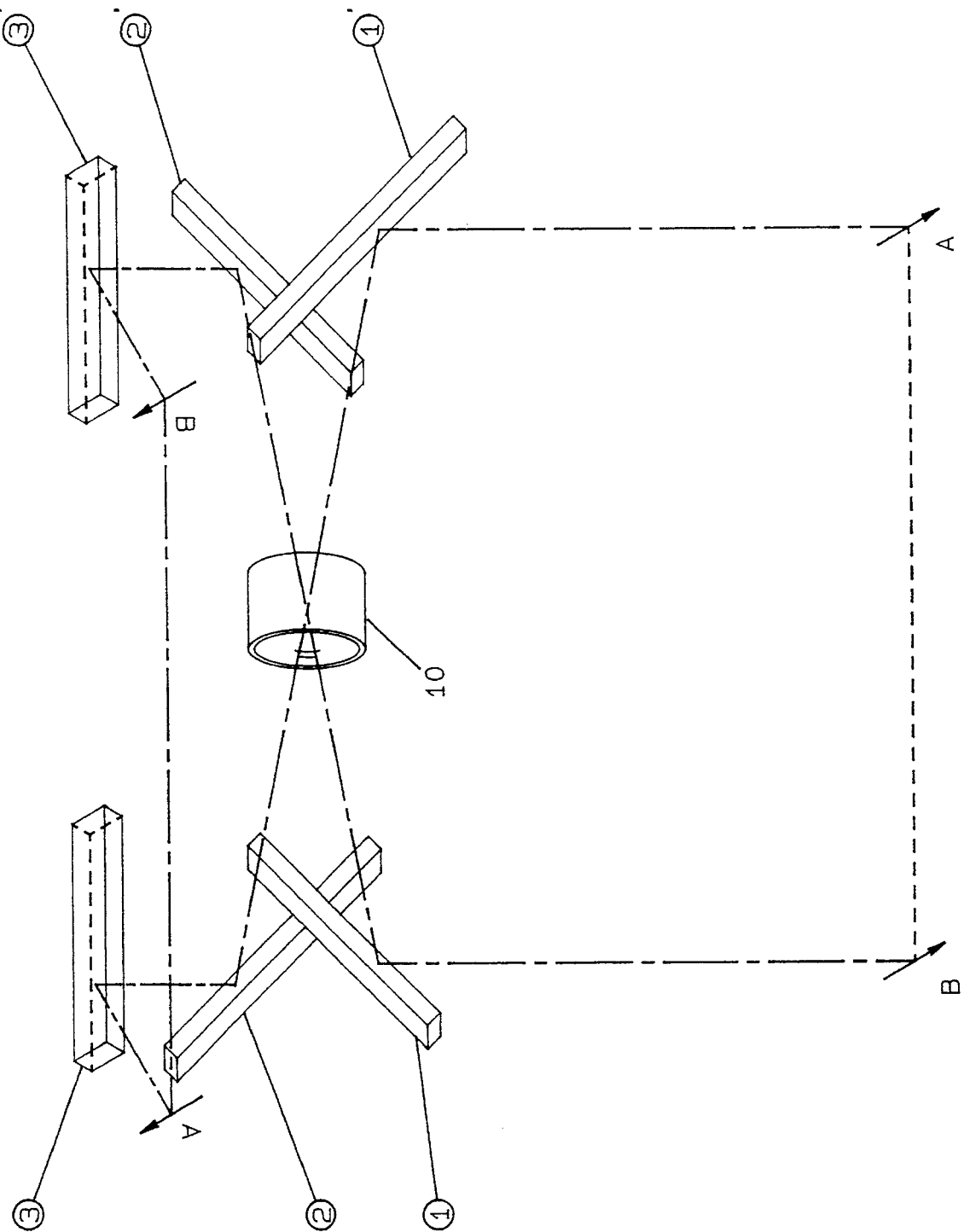
FIG. 4 is a schematic perspective diagram illustrating the fundamentals of another embodiment of the present photographing method, claimed hereinafter in claim 3.

The fundamentals of a photographing method according to the present invention, which is claimed hereinafter as claim 3, are illustrated in FIG. 4. Therein, rays reflected separately from a pair of second mirrors ② and ②' are further reflected by a pair of third mirrors ③ and ③' respectively prior to the formation of images on a photosensitive material. By adopting the mirror arrangement as described above, erecting images can be formed on a photosensitive material. When slit exposure is performed in this case, the photosensitive material is shifted synchronously with the movement of the original in the direction opposite to the moving direction of the original, as shown in FIG. 4.

Accordingly, the use of a photosensitive material for offset printing as the photosensitive material in the above-described embodiment can render a negative film for plate-making unnecessary, and so enables easy and direct production of an offset press plate (production of the so-called direct press plate).

Of course, the production of a direct press plate is known in itself. However, there can be gained from the present invention one great advantage that sufficiently high resolution can be secured although the lens used is only one lens and that with a narrow angle of view. By the way, in case the present apparatus has the same size as conventional ones, it is quite easy for the present apparatus to attain the resolving power heightened by two times those of conventional ones.

Figure 5:
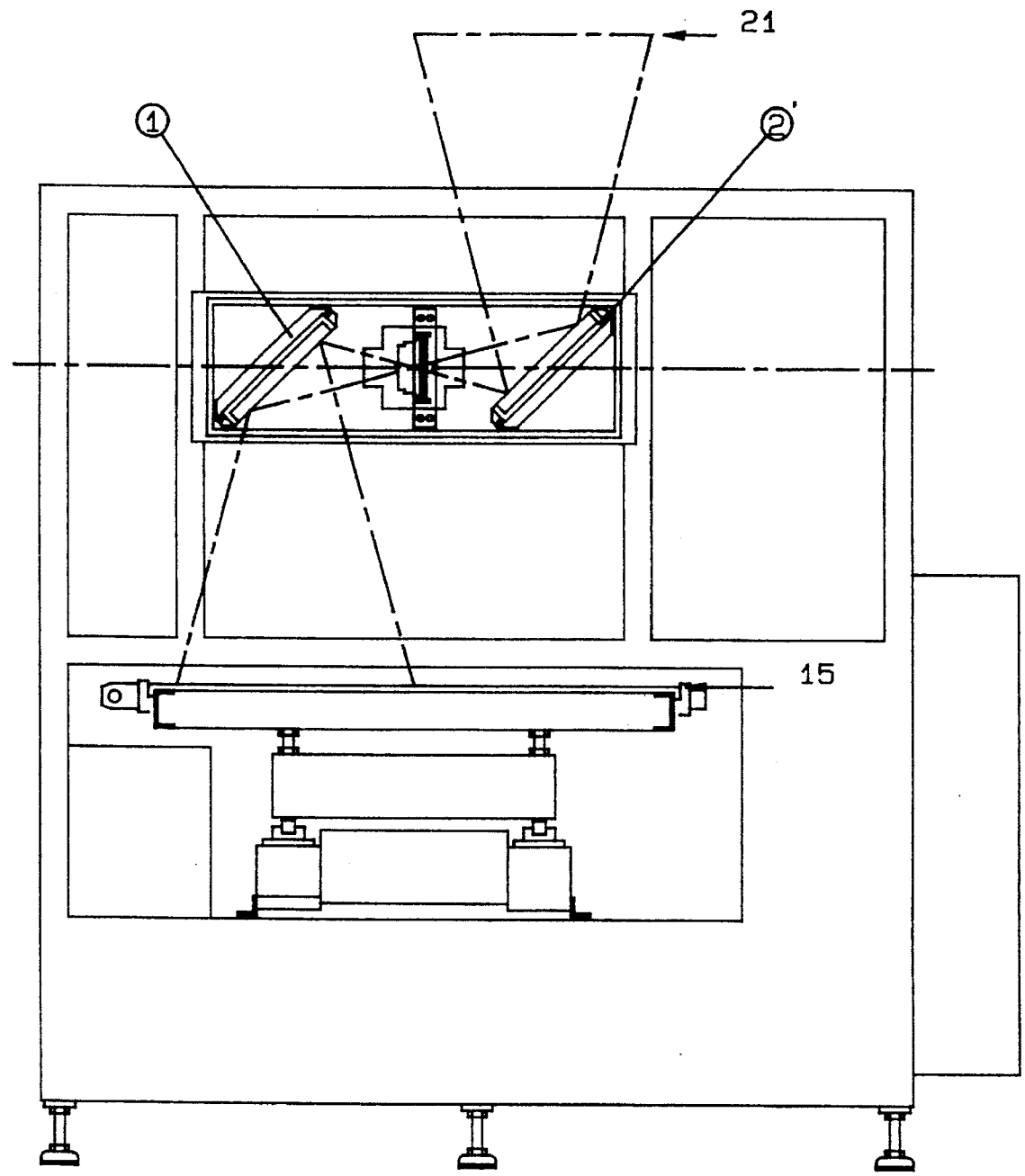
FIG. 5 is a front schematic elevational view, in cross-section, of an apparatus for printing photosensitive materials in accordance with the present invention, claimed hereinafter in claim 4.
Figure 6:
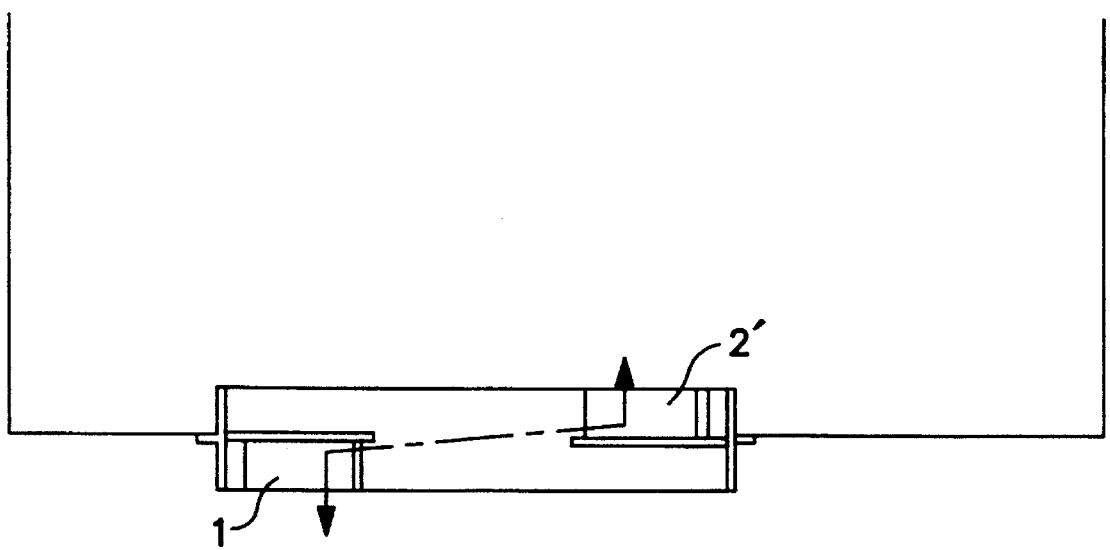
FIG. 6 is a schematic plan view illustrating the arrangement of mirrors in the camera in FIG. 5.
Figure 7:
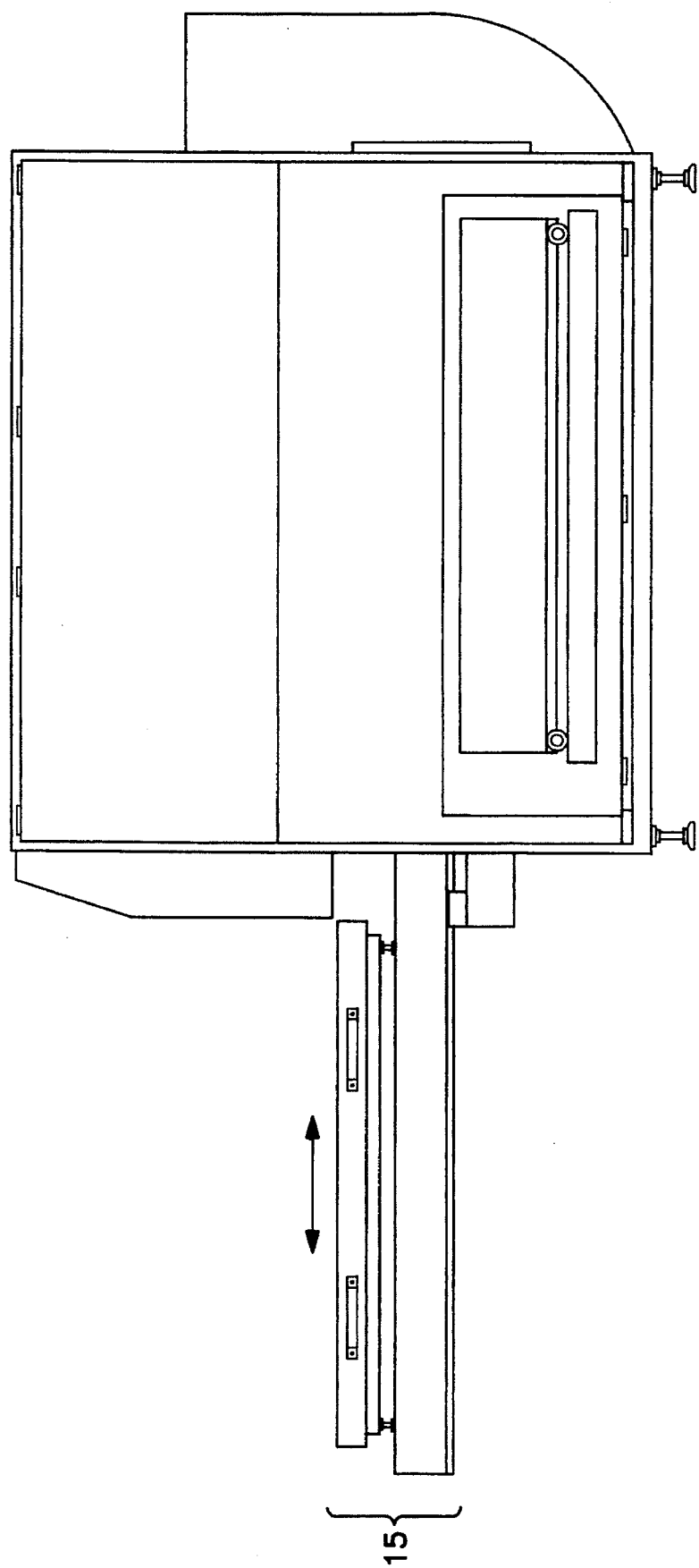
FIG. 7 is a side elevational view of the exterior of the present apparatus.

FIG. 5 is a front schematic elevational view, in cross-section, for illustrating the mirror arrangement in an apparatus according to the present invention as defined hereinafter in claim 4, FIG. 6 is a schematic plan view of the mirrors in the apparatus shown in FIG. 5, and FIG. 7 is a side elevational view of the exterior of said apparatus. As for the two pairs of mirrors, the mirrors drawn in FIG. 5 and FIG. 6 are only the first mirror on the left side and the second mirror on the right side, on which the light reflected from the first mirror strikes via a lens. The other mirrors are omitted therein with the intention of making it easy to see the travelling courses of rays. The light source, which is also omitted in FIG. 5, is arranged in a plane slightly deviated from the plane containing the first mirrors as well as from the plane containing the lens in the outward direction of the apparatus (in other words, on the front side of the page on which FIG. 5 is drawn) so that the rays reflected from the original can strike on the first mirrors. The numeral 17 in FIG. 7 represents a movable platen on which an original is placed.

Figure 8:
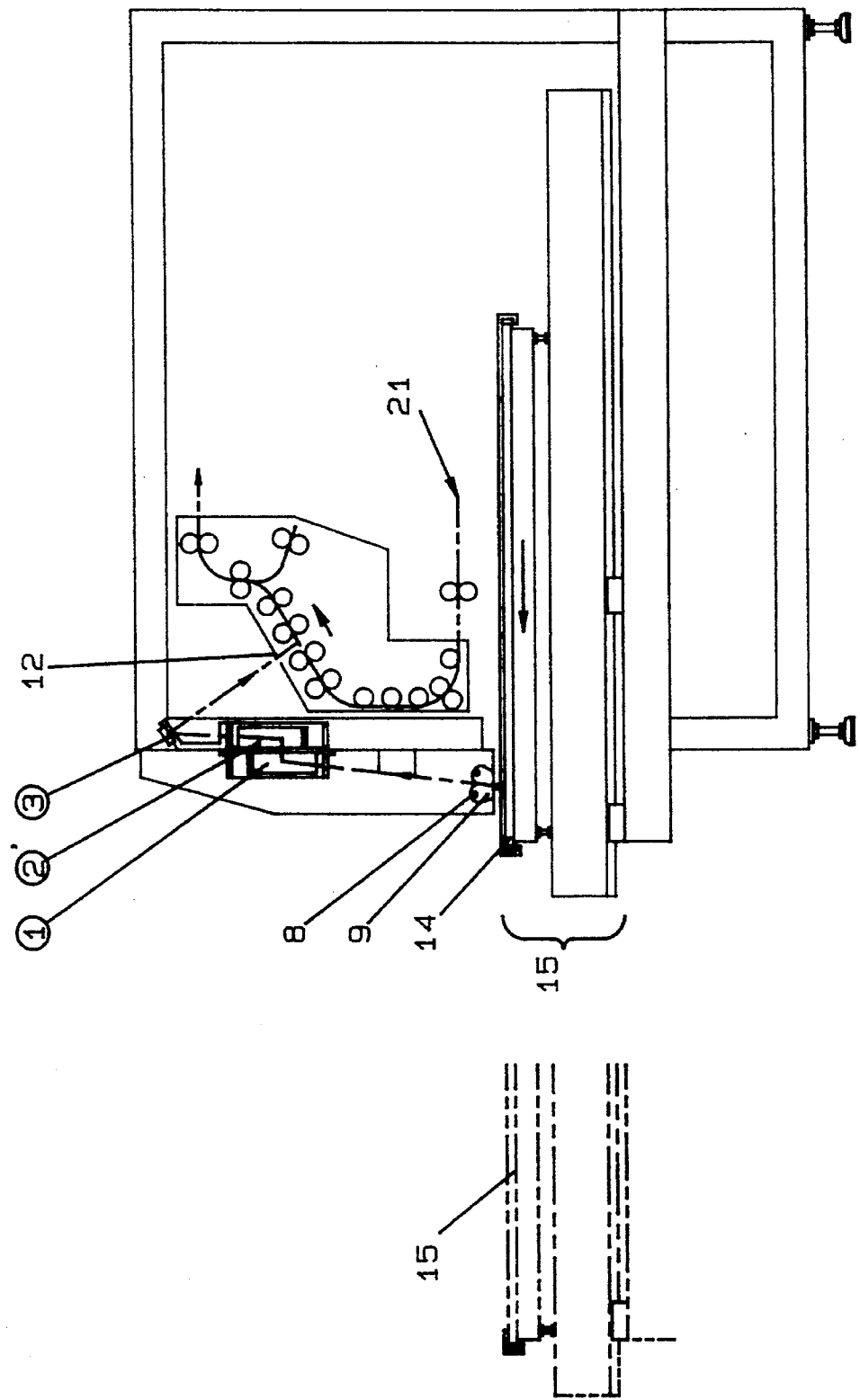
FIG. 8 is a side schematic elevational view, in cross-section, of an apparatus according to another embodiment of the present invention, claimed thereinafter in claim 8.

FIG. 8 is a side schematic elevational view, in cross-section, of an apparatus according to the present invention, which is claimed hereinafter as claim 8. In FIG. 8, the numeral 8 represents a light source for slit exposure, the numeral 9 a reflecting plate for the light source, the numeral 12 a slit, the numeral 14 an original board which forms a part of the platen 15. In addition, the arrows directing toward the mirror and the photosensitive material respectively indicate the proceeding direction of light reflected from the original, and the arrow under the photosensitive material and those respectively attached to the photosensitive material and the original board indicate the moving directions during the photographing operation.

Other means required of the present apparatus, including a means of automatically feeding photosensitive materials, a means of conveying photosensitive materials, a means of automatically developing photosensitive materials, a means of drying photosensitive materials, and a means of moving an original platen, can be designed properly.

Now, the present invention will be illustrated in more detail by reference to the following example. However, the invention should not be construed as being limited to this example.

EXAMPLE

Figure 9:
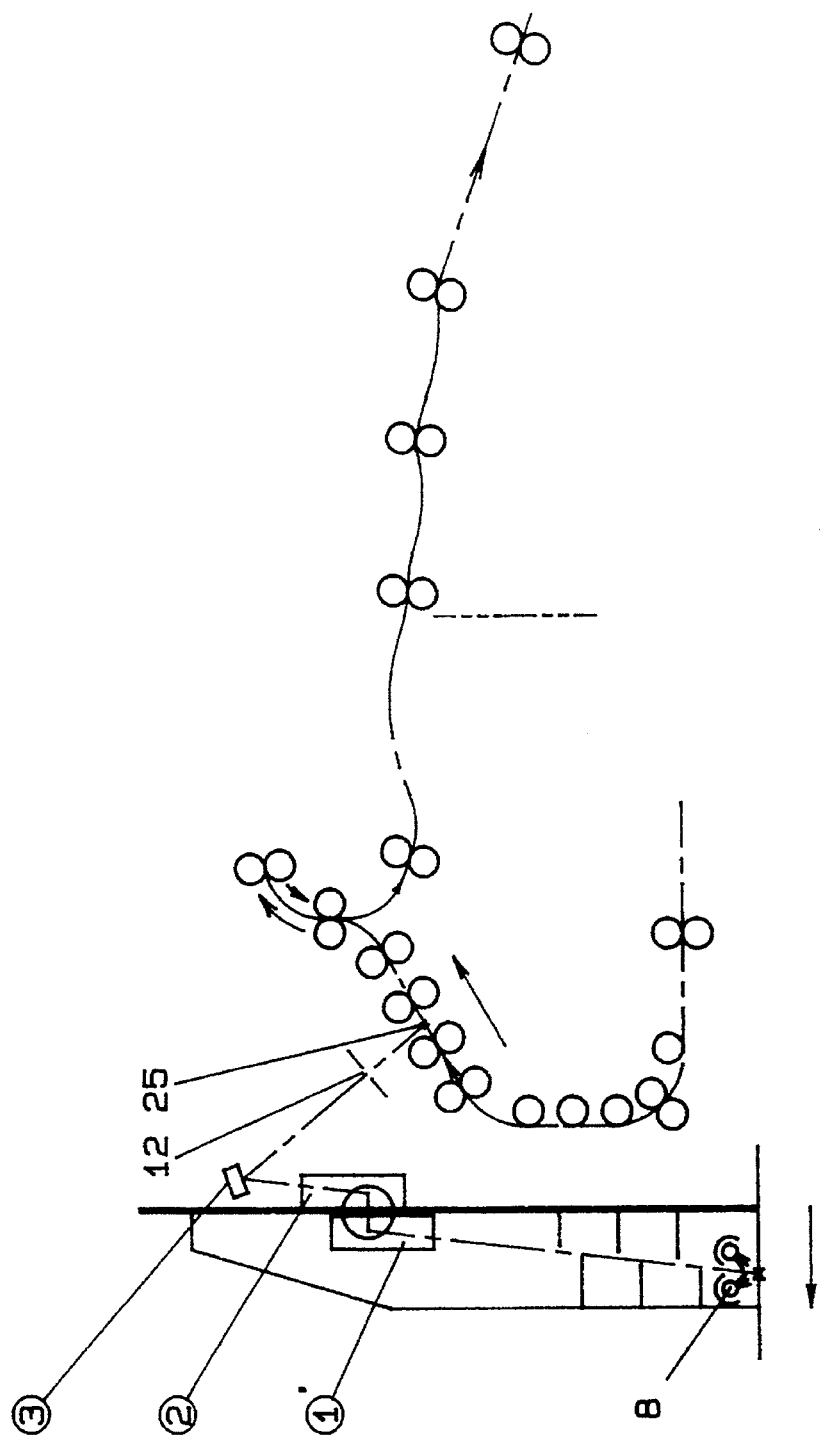
FIG. 9 is a schematic diagram illustrating the camera work according to the present embodiment claimed in claim 8.
Figure 10:
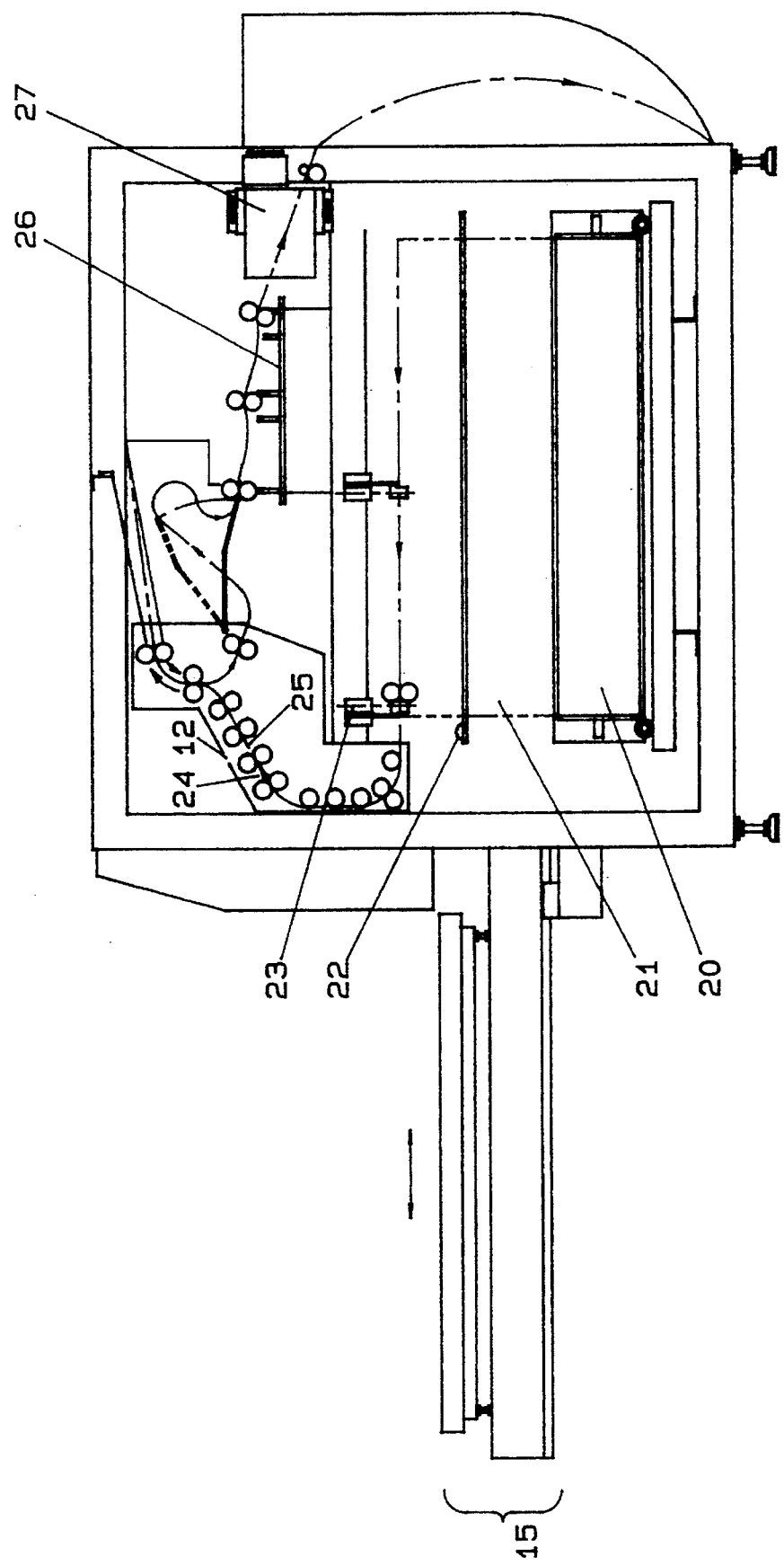
FIG. 10 is a schematic diagram illustrating a way of carrying a photosensitive material adopted in the present apparatus as claimed in claim 8.

An apparatus claimed as claim 8 hereinafter is schematically illustrated in FIG. 9, and the travel of a photosensitive material is schematically shown in FIG. 10.

The photographing process in said apparatus is described below: A photosensitive material 21 is sent out of a cartridge 20 set in the apparatus, and cut with a cutter 22. Then, the cut sheet of photosensitive material is forwarded in the direction opposite to the sending-out direction described above, and thereby is once pulled out the cut sheet from the carrier part. Further, the photosensitive material pulled out is cut into sheets having a size equal to an original, and the resulting sheets are conveyed toward the prescribed position. An original-size sheet of photosensitive material is made to stop at the prescribed position. Simultaneously with the stop, a punching means 23 moves onto the sheet and punches holes therein for mounting the sheet in the printing operation. Thereafter, the direction of conveying the sheet is changed by an angle of 90°, and the sheet is conveyed to the position 24 at which the sheet is at stand-by for the image formation (printing) thereon (that is to say, a stand-by position of image formation). Simultaneously therewith, the movement of the original platen 15 into the apparatus proper finishes, too. Thus, the preparation for photographing is completed.

At the conclusion of the preparation for photographing, the photosensitive material 21 and the original platen 15 begin their individual movements synchronously with each other, and at the same time a light source, which is not drawn in the figure, is turned on. Thus, the image formation (printing) on the photosensitive material starts at the prescribed position 25.

On completion of the photographing operation, the photosensitive material 21 is once sent forth to the upper part of the apparatus, and then reversedly changed in its traveling direction to be made to go toward the automatically developing means 26. The photosensitive material developed is dried with a drier 27, and then drawn off the apparatus.

What is claimed is:

1. A photographic method which comprises arranging a convex lens having optical properties symmetrical between the entrance side and the exit side of light in a position above an original such that the center of the lens may lie in the plane which contains the center line dividing the original symmetrically between the left and right halves and is perpendicular to the original; arranging two pairs of mirrors around said lens such that one pair of mirrors ① and ①' may be disposed separately on the left side and the right side of said lens, and that in symmetry with respect to the lens on the front side with respect to the optical axis of the lens, and the other pair of mirrors ② and ②' may be disposed separately on the left side and the right side of said lens, and that in symmetry with respect to the lens on the rear side with respect to the optical axis of the lens, and further the mirrors ① and ②' may be in point symmetry about the center of the lens and that may go for the mirrors ①' and ②, too; and inclining said mirrors at angles such that the rays incident on the mirror ①, which are rays reflected from the original by imagewise exposure, may pass through the lens and then be reflected by the mirror ②' and, at the same time the rays incident on the mirror ①' which are rays reflected from the original by imagewise exposure, may pass through the lens and then be reflected by the mirror ②: thereby covering the left half area of the original with the mirror ① and the right half area of the original with the mirror ①', and forming the whole images of the original on the same plane.

2. A photographic method according to claim 1, wherein the imagewise exposure is performed with a slit exposure system.

3. A photographic method according to claim 1, wherein the rays reflected separately from the mirrors ② and ②' are further reflected by a pair of mirrors ③ and ③' respectively to form the whole erecting images of the original on the same plane.

4. A photosensitive material printing apparatus comprising:

(i) a horizontally placed platen which has thereon an original and can come into and out of the apparatus proper while moving at a uniform velocity, (ii) a fixed slit exposure means for exposing the original to light, (iii) a convex lens which has its optical axis in a direction perpendicular to the moving direction of the platen on which the original is placed, and is arranged in such a position that it is located above an original so as to divide the picture plane of the original symmetrically between the left and right halves, and further so that the lens center may be slightly deviated towards the interior of the apparatus from the plane which contains a light source of the exposure means and is perpendicular to the original, (iv) two pairs of mirrors arranged around said lens such that a mirror ① can reflect the rays reflected from the left half area of the original to make them strike on the lens, a mirror ①' can reflect the rays reflected from the right half area of the original to make them strike on the lens, a mirror ②' can receive the rays reflected by the mirror ① and then transmitted by the lens to invert the image, and a mirror ② can receive the rays reflected by the mirror ①' and then transmitted by the lens to invert the image;

said lens and mirrors ①, ①', ② and ②' being disposed so that the whole area of the original may be photographed therewith as inverted images on one plane; and (v) a means of supplying a photosensitive material to the plane on which the inverted image is formed.

5. A photosensitive material printing apparatus according to claim 4, which is designed so that the moving speed of the original may be the same as the traveling speed of the photosensitive material and the magnifying factor thereof may be 1 by properly disposing the mirrors and the lens.

6. A photosensitive material printing apparatus according to claim 4, which has a built-in space for stocking photosensitive materials and a built-in means of feeding automatically the photosensitive materials.

7. A photosensitive material printing apparatus according to claim 4, which has a built-in means of automatically developing the photosensitive materials on which the images are printed.

8. A photosensitive material printing apparatus according to claim 4, wherein a pair of mirrors 3 and ③' for further reflecting the rays reflected from the mirrors ② and ②' are arranged so as to return the inverted images to the erecting images and the photosensitive material is supplied to the plane on which the erecting images are formed with the mirrors ③ and ③'.

* * * * *